United States Patent [19]

Boling, III

[11] Patent Number: 5,751,197

[45] Date of Patent: May 12, 1998

[54] LOW-POWER, SELF-QUENCHING SUPERREGENERATIVE DETECTOR

[75] Inventor: Harry O. Boling, III, Garland, Tex.

[73] Assignee: RF Monolithics, Inc., Dallas, Tex.

[21] Appl. No.: 665,459

[22] Filed: Jun. 18, 1996

[51] Int. Cl.$^6$ .............................. H04B 1/44; H04B 1/16
[52] U.S. Cl. ................. 331/107 A; 331/174; 329/359; 455/336
[58] Field of Search ............................. 331/174, 107 A; 329/359; 455/336

[56] References Cited

U.S. PATENT DOCUMENTS

| | | |
|---|---|---|
| 2,863,995 | 12/1958 | Chow . |
| 4,393,514 | 7/1983 | Minakuchi et al. ............... 455/336 |
| 4,749,964 | 6/1988 | Ash ................................. 331/107 A |
| 5,105,162 | 4/1992 | Fleissner et al. ................... 329/359 |
| 5,146,613 | 9/1992 | Anderson .............................. 455/78 |

Primary Examiner—Timothy P. Callahan
Assistant Examiner—An T. Luu
Attorney, Agent, or Firm—Jones, Day, Reavis & Pogue

[57] ABSTRACT

A low-power, self-quenching superregenerative receiver utilizes a single-port SAW device coupled to an RF oscillator to establish the frequency of oscillation at the output of the RF oscillator. A diode detector is coupled from the oscillator output for detecting a predetermined amplitude of the oscillation output signal. A time-constant circuit is coupled from the signal detector for generating an oscillator quench signal when the oscillator signal is detected and the oscillator quench signal has a predetermined duration set by the time-constant circuit. A feedback circuit couples the oscillator quench signal to the RF oscillator to cause the RF oscillator to switch to a non-oscillating condition only during the predetermined duration of the RF oscillator quench signal. The RF oscillator then switches to the oscillating condition and the system repeats itself.

10 Claims, 2 Drawing Sheets

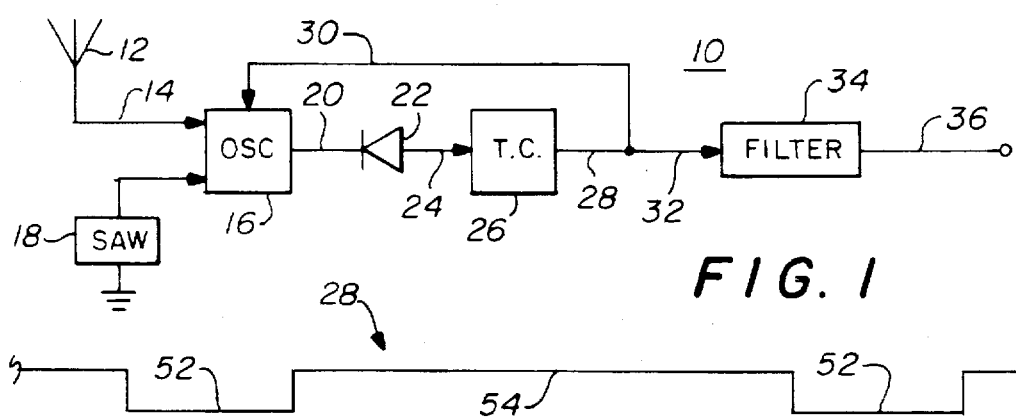
FIG. 1
FIG. 3
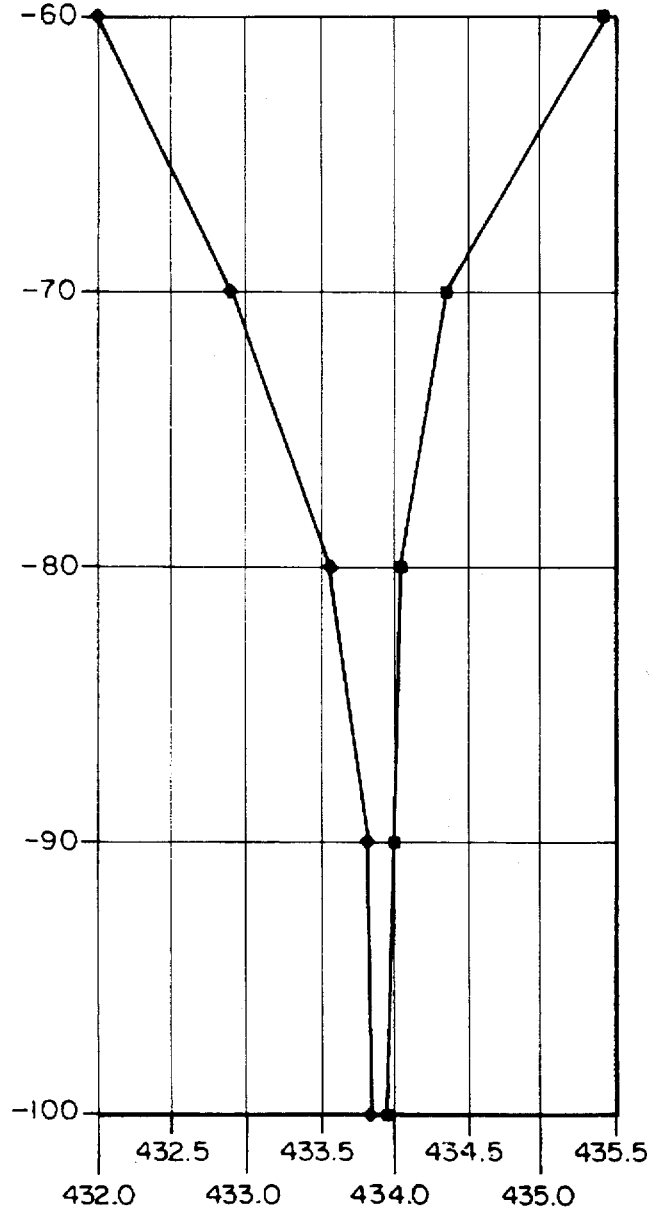
FIG. 4

LOW-POWER, SELF-QUENCHING SUPERREGENERATIVE DETECTOR

BACKGROUND OF THE INVENTION

1. Field of the Invention

The present invention relates to a superregenerative detector in general and in particular to a superregenerative detector having a single-port surface acoustic wave device coupled to the oscillator to establish the frequency of the output oscillation signal.

2. Description of Related Art Including Information Disclosed under 37 CFR 1.97 and 1.98

The superregenerative detector is a regenerative circuit in which an ordinary oscillator is automatically switched between an oscillating and a non-oscillating condition at a low frequency rate. The switching frequency is called the "quenching" frequency. In general, the quenching frequency must be increased as the carrier modulation frequency becomes greater, in accordance with sampling theory. With proper adjustment, oscillation will build up in the detector during the positive excursion or maximum of each cycle of the low frequency "quench" voltage and will die out during the negative excursion or minimum voltage of each cycle.

In the absence of an applied signal, the oscillation that builds up during each positive portion of the quench voltage cycle starts from an initial amplitude determined by the thermal noise present at the input of the circuit and reaches a final value corresponding to the equilibrium value for the oscillator. The oscillation then dies out during the negative or low portion of the quench voltage cycle. If an RF carrier is superimposed upon the system, the speed with which the oscillation build-up occurs increases in proportion to the strength (amplitude) of the RF carrier. The oscillation, therefore, reaches equilibrium more quickly in the presence of an external signal than when no external signal is applied. When a single transistor is configured to oscillate at both the RF frequency and the quench frequency, the quench frequency can usually be independently adjusted by altering the value of an RC circuit connected within the oscillator circuit. When an amplitude-modulated RF carrier is present, the desired modulation information is recovered at the output of a detector through a low-pass filter which rejects both the RF carrier and the quenching signal.

It is significant to note that only the start-up interval of the oscillation within the detector is required to provide satisfactory RF detection. During the on-time of the quenching operation, the time required for the oscillation to fully reach equilibrium is wasted and of no value in the detection process. However, it is imperative that the oscillation be allowed to die out completely during the quenching off-time to allow the re-establishment of true thermal noise conditions.

This type of circuit is valuable because it is simple and economical to construct and it reduces the effects of noise pulses of short duration because, in superregeneration, the system is sensitive to the incoming signal for only a small fraction of the total time. It is desirable to use such circuits in components such as receivers for garage door openers, remote keyless entry systems, alarm systems, and the like because of the small size, ease of construction, and economy of construction.

There are, however, some disadvantages. In the first place, the RF frequency of the oscillator circuit is normally LC controlled. That is, inductors and capacitors are utilized in the circuits which cause the oscillator to be unstable over time and to drift from its desired frequency of operation. In addition, any LC circuit is temperature sensitive which causes the frequency of operation to change as the temperature changes. Further, superregenerative receivers in the prior art have relatively wide reception bands and are therefore influenced by stray signals and noise which they can pick up and detect.

To overcome these problems, it is necessary to use a frequency-determining circuit which has low loss, is temperature stable, and provides the necessary phase shift from the output to the input to cause oscillation of the transistor. A surface acoustic wave delay line device is very temperature stable and would be ideal to place in the feedback circuit as a phase-shift element except that the prior art surface acoustic wave delay lines have an insertion loss which is so high that sufficient feedback cannot occur with a single transistor oscillator.

Prior art resonators that are formed of SAW devices have low insertion loss but have a Q that is so high that the quench circuit cannot function properly. Thus to construct a superregenerative detector with prior art SAW devices would prohibit the construction of a superregenerative detector with a single transistor and would have to be quite complex using a separate quench oscillator and other circuits which would negate simplicity and economy of construction.

Commonly assigned U.S. Pat. No. 4,749,964, entitled "Superregenerative Detector Having a SAW Device in the Feedback Circuit", which is incorporated herein by reference in its entirety, does in fact utilize a surface acoustic wave device in the feedback circuit that is not only a delay line but is also a low-loss device. Thus, it allows the construction of a superregenerative detector with one transistor that is temperature stable, that is not LC controlled, that does not drift in frequency, and that has a very narrow reception band thereby eliminating the reception of noise and stray signals which are close to the operating frequency of the detector.

It would be still more advantageous to have a superregenerative detector that is self-quenched, has no tuning involved, and is still more economical to build than that disclosed in commonly assigned U.S. Pat. No. 4,749,964.

SUMMARY OF THE INVENTION

The present invention provides a self-quenched superregenerative detector that utilizes a single-port resonator to establish the frequency of oscillation of the transistor oscillator. There is no tuning involved and it is more economical to build because the single-port resonator is much less expensive to build than the two-port resonator disclosed in commonly assigned U.S. Pat. No. 4,749,964. Because of the high Q of the single-port resonator, the oscillator would normally turn on and off so slowly as to preclude detection of an RF carrier which is modulated at a nominal rate.

However, with the present invention, within the first 30 microseconds after the oscillator begins to oscillate, a signal detector provides an output to a separate quench circuit that has a time constant formed therein and which provides an oscillator control signal to a feedback loop connected to the oscillator to cause the oscillator to cease operation during the existence of the predetermined duration of the oscillator control signal formed by the time-constant circuit. The required on-time of the oscillator is thus reduced to a minimum, thus maximizing the quench frequency and, as a result, the acceptable data rate of the detected modulated RF input signal.

Thus, the novel invention utilizes a single-port resonator that is much less expensive to construct than the resonators of the prior art, which are at least two ports, the oscillations are self-quenched, no tuning is involved, and the circuit operates with less than two milliamps of DC current and thus requires very low power. A filter is coupled to the output of the quench circuit for filtering out the RF carrier and the quench signal and recovering the RF modulation signal.

Thus, the present invention relates to a low-power, self-quenching superregenerative detector comprising an RF oscillator having a signal input and an oscillation signal output, a single-port SAW resonator coupled to the RF oscillator to establish the frequency of the output oscillation signal, a signal detector coupled to the oscillator output for detecting a predetermined amplitude of the oscillator output signal, a time-constant circuit coupled to the signal detector for generating an oscillator quench signal when the oscillator signal is detected, the oscillator quench signal having a predetermined duration set by the time-constant circuit, and a feedback circuit which couples the oscillator quench signal to the RF oscillator to cause the RF oscillator to switch to a non-oscillating condition only during the predetermined duration of the RF oscillation quench signal and then switching back to the oscillating condition.

BRIEF DESCRIPTION OF THE DRAWINGS

These and other features of the present invention will be more fully disclosed when taken in conjunction with the following DETAILED DESCRIPTION OF THE PREFERRED EMBODIMENT in which like numerals represent like elements and in which:

FIG. 1 is a block diagram representation of the novel superregenerative detector of the present invention;

FIG. 3 is a waveform representing the commencement of oscillation of the oscillator and the occurrence of the quench signal determined by the time constant which causes the RF oscillator to switch between an oscillating and a non-oscillating condition; and FIG. 4 is a graph representing signal input level versus frequency and illustrating that as the signal becomes weaker the detection band of the present invention becomes more narrow thus providing good selectivity for weak signals.

DETAILED DESCRIPTION OF THE PREFERRED EMBODIMENT

Figure 2:
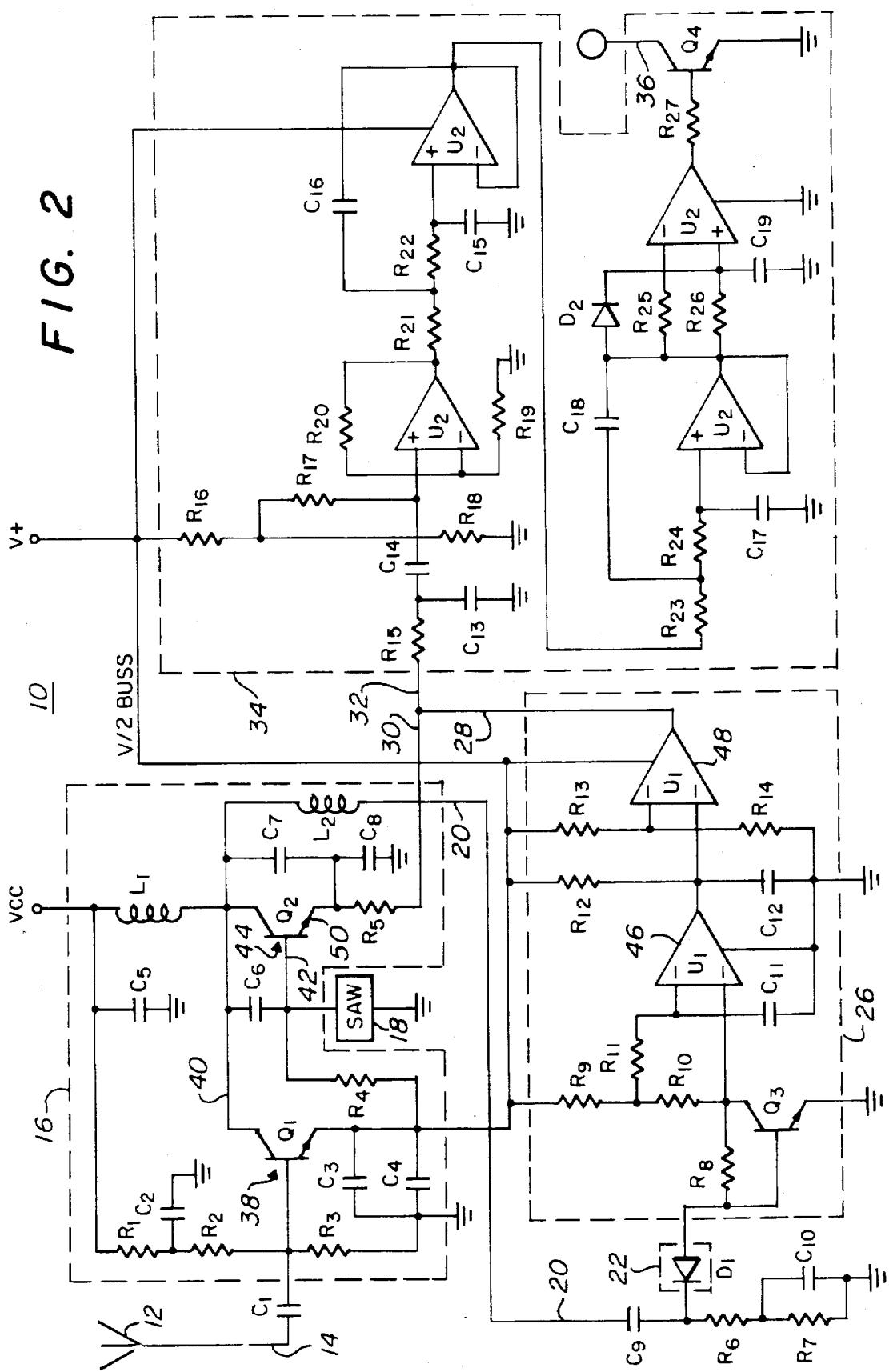
FIG. 2 is a detailed circuit diagram of the novel invention corresponding to the block diagram of FIG. 1.

FIG. 1 is a block diagram of the circuitry of the present novel superregenerative detector 10. The modulated RF signal is received by antenna 12 and coupled on line 14 to oscillator 16. A single-port surface acoustic wave device 18 is coupled to the oscillator 16 to determine the frequency of oscillation thereof. The manner in which such SAW devices establish the frequency of oscillation of oscillator 16 is well known in the art and will not be described in detail here. The output of oscillator 16 on line 20 is detected by a detector 22 when it reaches a predetermined amplitude such as in the range of −35 to −45 dBm. The detected signal on line 24 is coupled to a time-constant circuit 26 which, as will be seen, hereafter uses an RC time-constant circuit to provide an output signal on line 28 that is coupled back to oscillator 16 through line 30 as a feedback signal to cause the oscillator to cease oscillation and is also coupled on line 32 to filter 34 which is a low-pass filter that rejects the RF carrier frequency and the quench frequency and thus allows the modulation signal to be transmitted on line 36 to additional circuits for further processing.

FIG. 2 discloses the details of the novel circuit of FIG. 1. The modulated RF signal is received at antenna 12 and coupled on line 14 through capacitor C1 to a first transistor amplifier 38 ($Q_1$) of oscillator circuit 16. The output of $Q_1$ on line 40 is coupled to the collector of the oscillator transistor 44 ($Q_2$) which, along with capacitors C7 and C8, and resonator R5, form a Colpitts oscillator. The surface acoustic wave device 18, a single-port surface acoustic wave resonator, is coupled on line 42 to the base of transistor $Q_2$ and establishes the frequency of operation of the oscillator circuit 16 as is well known in the art. The output of oscillator 16 on line 20 is coupled through capacitor C9 to detector 22 which may be a diode, $D_1$. Diode $D_1$ is designed to detect the output from oscillator 16 on line 20 within the first 30 microseconds of oscillation. This means that the oscillator 16 can be quenched at a rapid rate in spite of the use of SAW 18 as a single-port device with a high Q because the oscillation is detected within a very short period of time after it commences. The signal detected by diode $D_1$ is coupled to time-constant circuit 26 through amplifier transistor $Q_3$ and comparator 46. The output of comparator 46 is coupled to the time-constant circuit formed by resistor R12 and capacitor C12. This time constant is generally in the order of 330 microseconds but may vary so long as it is short enough to permit effective sampling of the modulated RF carrier frequency at the input. The output from the time-constant circuit is coupled to comparator 48 that generates an output signal on line 28 and is coupled to line 30 back to the emitter 50 of transistor $Q_2$, the oscillator, to cause the oscillator to cease oscillation.

The resultant output waveform line 28, shown in FIG. 3, comprises two parts. The low-going portion 52 of the waveform 28 is the oscillator-on portion. It is during this time period that the oscillation amplitude builds to a detectable level and the signal is generated which turns the oscillator off. The high-going portion 54 is the oscillator-off portion and is of fixed duration, established by the R12-C12 time constant in conjunction with the comparator 48 threshold (R13-R14). When the off-time has expired, the oscillator begins to oscillate again. The process repeats continuously, modified only by the presence of an RF signal at the system input. The oscillator on-time is reduced in proportion to the amplitude of an RF input signal. It is this variation in on-time that produces the usable detector output.

The output from time-constant circuit 26 on line 28 is also coupled on line 32 to filter 34. Filter 34 is a well-known, low-pass filter that recovers the RF modulation signal while excluding the RF carrier signal and the quench signal. The output is generated then on line 36.

FIG. 4 is a graph showing the frequency response of the device versus a given input signal. It will be noticed in FIG. 4 that the smaller the input signal the more narrow the bandwidth of the receiver. This makes the receiver very selective to low-power signals.

Thus the present invention is novel in that it uses a single-port SAW resonator coupled to the RF oscillator to establish the frequency of the output oscillation signal. A second novel feature of the present invention is to use a signal detector coupled to the oscillator output for detecting a predetermined amplitude of the oscillator output signal, generally within the first 30 microseconds of oscillation, and within a predetermined amplitude range of −35 to −45 dBm so that the oscillations are controlled at a very low amplitude of the oscillator output signal.

Another novel feature of the present invention is to form a self-quenching circuit using a time-constant circuit coupled to the signal detector for generating the oscillating quench signal when the oscillator signal is detected and such that the quench signal has a predetermined duration set by the time-constant circuit.

The novel invention utilizes the oscillator quench signal in a feedback circuit to the RF oscillator to cause the RF oscillator to switch to a non-oscillating condition only during the predetermined duration of the RF oscillator quench signal and then it switches back to the oscillating condition.

A parts listing follows setting forth the value of each of the components utilized in the novel circuit illustrated in FIG. 2.

| Parts Listing | |
|---|---|
| Reference Designator | Value |
| C1, C5, C3, C17 | 470 |
| C2, C4, C10, C14, C19 | .1µ |
| C7 | 5 |
| C8 | 9 |
| C9 | 18 |
| C11, C12 | .01µ |
| C13, C16 | 1800 |
| C15 | 1200 |
| C18 | 4700 |
| D1 | MMBD101 |
| D2 | MMBD914 |
| L1 | 12nH |
| L2 | 180nH |
| Q1 | NE60833 |
| Q2 | NE94430 |
| Q3 | BC848CT |
| Q4 | MMBT3904 |
| R1, R9 | 15k |
| R2 | 4.7k |
| R3 | 39k |
| R4 | 4.3k |
| R5 | 1000 |
| R6 | 130 |
| R7 | 27k |
| R8 | 56k |
| R10 | 27 |
| R11, R15, R27 | 100k |
| R12 | 33k |
| R13, R19 | 470k |
| R14 | 220k |
| R16, R17, R20, R26 | 1M |
| R18 | 82k |
| R21, R22, R23, R24 | 110k |
| R25 | 0 |
| SAWR1 | R02101A |
| U1 | LM393MM |
| U2 | LM324MM |

The corresponding structures, materials, acts, and equivalents of all means or step plus function elements in the claims below are intended to include any structure, material, or act for performing the function in combination with other claimed elements as specifically claimed.

We claim:

1. A low-power, self-quenching superregenerative detector comprising:

an RF oscillator having a signal input and an oscillation signal output;

a single-port SAW resonator coupled to said RF oscillator to establish the frequency of said output oscillation signal;

a signal detector coupled to the oscillator output for detecting a predetermined amplitude of the oscillator output signal;

a time-constant circuit coupled to said signal detector for generating an oscillator quench signal when said oscillator signal is detected, said oscillator quench signal having a predetermined duration set by said time-constant circuit; and a feedback circuit coupling the oscillator quench signal to said RF oscillator to cause said RF oscillator to switch to a non-oscillating condition only during said predetermined duration of said RF oscillator quench signal and then switching to the oscillating condition.

2. A superregenerative detector as in claim 1 wherein said RF oscillator includes:

at least one transistor having a base, a collector, and an emitter;

said single-port resonator being coupled to the base of said at least one transistor to establish said RF oscillation signal output frequency; and said oscillator quench signal feedback circuit being coupled to the emitter of said at least one transistor to switch said RF oscillator from an oscillating condition to a non-oscillating condition.

3. A superregenerative detector as in claim 2 wherein said time-constant circuit comprises:

a first comparator having a first input coupled from said detector, a first reference voltage as a second input, and an output coupled to said time-constant circuit for charging said time-constant circuit when said predetermined amplitude of said oscillator signal is detected; and a second comparator having a first input coupled from said time-constant circuit, a second reference voltage as a second input, and an output coupled to the emitter of said at least one transistor in said RF oscillator to form said oscillator quench feedback circuit.

4. A superregenerative detector as in claim 3 further including:

said RF oscillator input receiving a modulated RF carrier signal; and a low-pass filter circuit coupled from said second comparator output for receiving said second comparator output and recovering said modulation.

5. A superregenerative detector as in claim 1 wherein said predetermined amplitude of said oscillator signal output is in the range of between −35 and −45 dBm.

6. A superregenerative detector as in claim 5 wherein said predetermined amplitude of said oscillator output signal is detected within the first 30 microseconds of said oscillation.

7. A superregenerative detector as in claim 4 wherein the predetermined duration of said time constant is such that the oscillator quench frequency will permit detection of the modulation on the RF carrier input.

8. A low-power, self-quenching superregenerative receiver comprising:

an RF oscillator having an input for receiving a modulated RF signal and an output;

a single-port surface acoustic wave device coupled to said RF oscillator to establish the frequency of oscillation at the output of said RF oscillator;

a quench circuit having an input coupled to the output of said RF oscillator and an output for providing a periodic quench signal;

a feedback circuit coupling said periodic quench signal to said RF oscillator to switch said RF oscillator between an oscillating and a non-oscillating condition; and a filter coupled from said quench circuit output for filtering said quench signal and recovering said RF modulation signal.

9. A low-power, self-quenching superregenerative receiver as in claim 8 wherein said quench circuit further comprises:

a diode detector coupled from the output of said RF oscillator for detecting a predetermined amplitude of said output oscillations;

a time-constant circuit coupled from said detector for providing a quench signal of predetermined duration; and a feedback circuit means for coupling said quench signal from said time-constant circuit to said RF oscillator to switch said RF oscillator from an oscillating condition to a non-oscillating condition only during the duration of said time constant.

10. A low-power, self-quenching superregenerative receiver as in claim 9 wherein said time-constant circuit includes a resistance/capacitance circuit for establishing said time duration.

* * * * *

UNITED STATES PATENT AND TRADEMARK OFFICE
CERTIFICATE OF CORRECTION

PATENT NO. : 5,751,197
DATED : May 12, 1998
INVENTOR(S) : Boling III

It is certified that error appears in the above-indentified patent and that said Letters Patent is hereby corrected as shown below:   On title page,
Item [19], "Boling, III" should read --Boling, III, et al--

On title page, insert, under [75] "Inventor:", Patrick W. Evan, Kaufman, Texas, was omitted.

Signed and Sealed this

Third Day of November, 1998

Attest:

BRUCE LEHMAN

*Attesting Officer*        *Commissioner of Patents and Trademarks*